UNIJUNCTION OSCILLATOR WITH PLURAL OUTPUTS DEPENDING ON INPUT CONTROL
Filed May 3, 1963
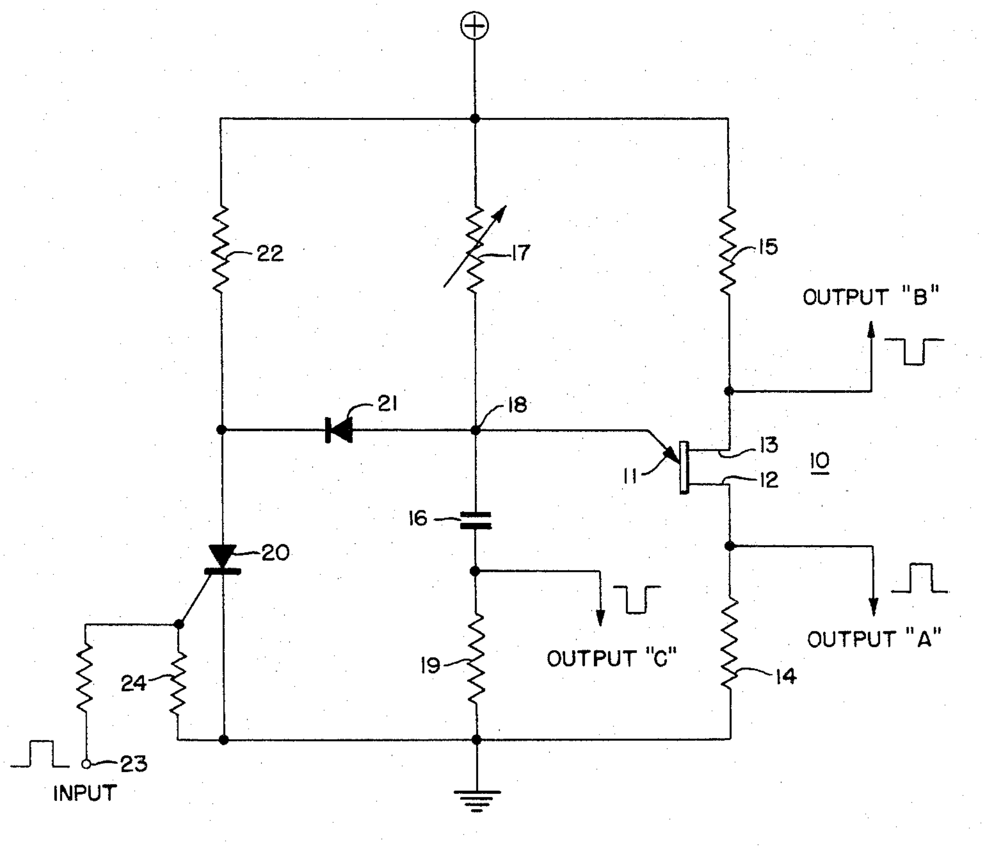
INVENTOR
CHARLES J. ROCCA
BY R. C. Perry
ATTORNEY United States Patent Office 3,210,686
Patented Oct. 5, 1965

3,210,686

UNIJUNCTION OSCILLATOR WITH PLURAL OUTPUTS DEPENDING ON INPUT CONTROL

Charles J. Rocca, Rochester, Minn., assignor to Teletype Corporation, Skokie, Ill., a corporation of Delaware Filed May 3, 1963, Ser. No. 277,936
3 Claims. (Cl. 331—60)

This invention relates to pulse generating circuits and more particularly to pulse generating circuits having more than one mode of operation.

Some applications for pulse generators or clock circuits exist which require two outputs of the same frequency from the pulse generator; at times it is desirable to provide pulses at only one of these outputs in response to external signals while maintaining the other output off thus requiring some means for providing two distinct modes of operation of the pulse generator. Other applications in which pulse generating circuits are used require means for temporarily disabling the pulse generator in response to an external signal at the end of which the pulse generator is returned to its normal mode of operation.

It is well known in the art to use unijunction transistor relaxation oscillators as pulse generators or clock circuits since such unijunction circuits provide a stable output frequency over a wide temperature range. However, the conventional unijunction transistor relaxation oscillator previously known in the art is incapable of performing all of these different functions inasmuch as it has only a single mode of operation, that is, that of a free running oscillator. It has been proposed in the art to control such a unijunction transistor oscillator by means of a control circuit including a transistor connected across the timing capacitor of the oscillator for turning the oscillator on and off. While this type of circuit enables a somewhat wider range of uses to be performed by the unijunction oscillator, such a system is incapable of providing one of two clock pulse outputs in response to external signals while maintaining the other output dormant or off.

Accordingly, it is an object of this invention to provide a pulse generator which is capable of generating clock pulses simultaneously at at least two different outputs in one mode of operation and which supplies clock pulses at only one of these two outputs in synchronism with input pulses applied to the pulse generator in a second mode of operation.

It is another object of this invention to provide a clock pulse generator which may be gated on and off in response to input signals.

It is a more specific object of this invention to provide a clock pulse generator utilizing a unijunction transistor and a PNPN semiconductor switching device in a pulse generator which may have a plurality of outputs, at least one of which is dependent upon the operation of the unijunction transistor and another of which is dependent upon operation of either the unijunction transistor or the PNPN switching device.

A pulse generator circuit made according to this invention comprises a basic unijunction transistor relaxation oscillator to which has been added a control circuit in the form of a PNPN semiconductor switching device connected in parallel with the timing capacitor of the relaxation oscillator. When the switching device is nonconductive, the circuit functions as a conventional relaxation oscillator with the timing capacitor discharging through a first loop including the unijunction transistor. However, when input pulses or signals are applied to the gate electrode of the switching device to render it conductive, a second discharge loop is provided for the capacitor since the switching device shunts the capacitor; and the capacitor rapidly discharges through this second discharge loop. An additional output terminal is provided in the portion of the capacitor discharging loops which is common to both of them. As a consequence, when the circuit is operating as a relaxation oscillator, output pulses are obtained from the conventional output terminals located at the bases of the unijunction transistor and from the additional output terminal. When input pulses are applied to the switching device prior to the time the capacitor attains a predetermined charge sufficient to drive the unijunction transistor into conduction, the capacitor discharges through the switching device; and output pulses are obtained only from the additional output terminal with no output pulses being obtained from the bases of the unijunction transistor since it does not conduct.

If a gating signal is maintained at the gate of the switching device, the capacitor initially discharges through the switching device. Since the switching device then remains conductive, the capacitor does not commence recharging until the gating signal is removed thereby rendering the switching device nonconductive to allow normal recharging of the timing capacitor to take place.

Further objects and features of this invention will become apparent to those skilled in the art upon consideration of the following detailed description taken in conjunction with the drawings, the single figure of which shows a circuit diagram of a preferred embodiment of the invention.

Referring now to the drawing, there is shown a pulse generating circuit including therein a unijunction transistor 10 having an emitter 11, a base-one 12 and a base-two 13. The bases 12 and 13 are connected in series with a pair of resistors 14 and 15 between a source of positive D.C. potential and ground. A timing capacitor 16 is charged over a path extending from ground through a resistor 19, capacitor 16, a junction 18 and a variable resistor 17 to the source of positive potential. The emitter 11 of the unijunction transistor 10 is connected to the junction 18 and this portion of the circuit, operating alone, functions as a conventional unijunction transistor relaxation oscillator such as that shown on page 194 of the Transistor Manual, Sixth Edition, published by the General Electric Company, 1962.

The unijunction transistor 10 is normally nonconductive until the timing capacitor 16 is charged to such a potential that the voltage at junction 18 and thus at the emitter 11, rises sufficiently to forward bias the emitter-base-one junction causing the unijunction transistor to conduct. When this occurs, the capacitor 16 discharges rapidly through the emitter 11 and base-one 12 of the unijunction transistor and resistors 14 and 19. A positive output pulse then is obtained at output A connected to the base-one 12 of the unijunction transistor 10 and a negative output pulse is obtained from output C due to the voltage drop across the resistor 19 which has been added to the basic oscillator circuit shown in the aforementioned reference in the book Transistor Manual. Another negative pulse may be obtained from an output B connected to the base-two 13 of the unijunction transistor 10.

When the capacitor 16 has discharged, the transistor 10 is again rendered nonconductive due to the fact that the voltage at the junction 18 drops to a point below that required to forward bias the emitter-base-one junction of the transistor. As a result, the capacitor 16 commences charging from the source of positive potential through the variable resistor 17 until the predetermined voltage is once again attained causing the above sequence of operation to be repeated. The frequency of oscillation of the oscillator may be varied by changing the resistance of the variable resistor 17 which causes the rate of charge of the capacitor 16 to change.

In accordance with this invention the basic unijunction transistor relaxation oscillator circuit described above has been modified by the addition of a control device in the form of a normally nonconducting PNPN semiconductor switching device which is shown in the drawing as a silicon controlled rectifier 20. The cathode of the silicon controlled rectifier 20 is connected to ground and its anode is connected to the junction 18 through a diode 21. The anode of the rectifier 20 is connected to the source of positive potential through a suitable resistance 22.

As long as the silicon controlled rectifier 20 is nonconductive, the relaxation oscillator circuit functions in the conventional manner as described previously. In order to prevent any possible leakage of the charge on the capacitor 16 from taking place through the silicon controlled rectifier 20 when it is nonconductive, the resistor 22 and the diode 21 are provided. When the silicon controlled rectifier 20 is nonconductive, the potential on its anode and on the cathode of the diode 21 rises to approximately the full value of the source of positive potential. At the same time, the potential at the junction 18 is considerably lower due to the drop across the resistor 17, thereby back biasing the diode 21 which prevents leakage from the capacitor 16 through the silicon controlled rectifier 20.

When the silicon controlled rectifier 20 is rendered conductive by an input pulse or signal applied to its gate electrode at terminal 23, a shunt is placed across the capacitor 16 causing it to discharge in a second loop comprising the diode 21, silicon controlled rectifier 20 and the resistor 19. If the silicon controlled rectifier 20 is rendered conductive prior to the time the capacitor 16 attains the predetermined charge necessary to trigger the unijunction transistor 10 into conduction, the capacitor discharge through the silicon controlled rectifier 20 without discharging any current through the loop including the unijunction transistor 10. The discharge of the capacitor 16 takes place rapidly due to the characteristics of the silicon controlled rectifier 20 causing a sudden voltage drop to occur across the resistor 19 which results in a negative output pulse from the output C. It is to be noted that no output pulses are obtained from the outputs A and B at this time since the unijunction transistor 10 is not rendered conductive due to the fact that the capacitor 16 is caused to discharge prior to the time it attains the voltage necessary to trigger the unijunction transistor 10 into conduction.

A resistor 24 is connected between the gate electrode of the silicon controlled rectifier 20 and ground to prevent the silicon controlled rectifier from being rendered conductive by anode to cathode leakage current.

In view of the foregoing it is apparent that a plurality of simultaneous outputs can be obtained from the circuit when the silicon controlled rectifier 20 is in its normally nonconductive state. These outputs are a result of the normal oscillations occurring in the relaxation oscillator circuit including the unijunction transistor 10 and the timing capacitor 16, and output pulses occur simultaneously at the same frequency from outputs A, B and C.

If external synchronizing pulses are applied to the terminal 23 and thus to the gate electrode of the silicon controlled rectifier 20 at a frequency which is higher than the normal frequency of oscillation of the relaxation oscillator portion of this circuit, output pulses are obtained only from output C in synchronism with the applied external synchronizing pulses. No pulses are obtained in this mode of operation from outputs A and B since the capacitor 16 is never allowed to be charged to the voltage necessary to trigger the unijunction transistor 10 into conduction.

If a gating signal of relatively long duration is applied to the silicon controlled rectifier 20, the capacitor 16 immediately discharges through the silicon controlled rectifier 20 and an output pulse may appear at output C. The capacitor 16 then is prevented from recharging due to the fact that, so long as the gating signal is present on the input terminal 23, the silicon controlled rectifier 20 remains open or conductive preventing any charge from being stored on the timing capacitor 16. As a consequence, no further output pulses are obtained from any of the outputs A, B or C as long as the gating signal remains applied to the terminal 23. As soon as this signal is removed, the silicon controlled rectifier 20 becomes nonconductive and the capacitor 16 begins charging, readying the circuit for subsequent normal operation.

In summary, it may be seen that the clock pulse generating circuit of this invention is capable of three distinct types or modes of operation. In the first mode with the silicon controlled rectifier 20 held nonconductive, the unijunction transistor 10 and the timing capacitor 16 operate as a relaxation oscillator circuit and output pulses are obtained from all three output terminals A, B and C at a frequency determined by the parameters of the oscillator. In the second mode of operation, when external synchronizing input pulses are applied to the gate electrode of the silicon controlled rectifier 20 to render it conductive prior to the time the capacitor 16 attains a sufficient voltage to trigger the unijunction transistor 10 into conduction, the capacitor 16 periodically discharges through the silicon controlled rectifier 20 in synchronism with the external pulses, and output pulses are obtained from the output terminal C only. In the third mode of operation, when a gating potential is applied to the gate of the silicon controlled rectifier 20 to hold the rectifier 20 open or conductive, the capacitor 16 is prevented from being charged or storing any electrical energy and no output pulses are obtained from any of the outputs A, B or C until the gating potential is removed from the gate of the silicon controlled rectifier 20 causing it to become nonconductive.

Although the invention has been described with reference to a specific embodiment, it will be apparent to those skilled in the art that various changes and modifications may be made in that embodiment without departing from the spirit and scope of the invention.

What is claimed is:

1. A pulse generator including (a) a unijunction transistor and an electrical energy storage device, (b) means for supplying electrical energy to the storage device, (c) means for connecting the unijunction transistor and the storage device in a relaxation oscillator circuit including a first energy discharge loop for the energy storage device through which the storage device periodically discharges at a frequency determined by the rate at which the storage device is supplied with a predetermined amount of energy by the energy supplying means, the storage device releasing energy through the unijunction transistor in the first loop each time the predetermined amount of energy is attained, (d) a normally nonconductive PNPN semiconductor switching device having a gate electrode, (e) means for connecting the switching device and the energy storage device in a second loop circuit, (f) means for applying input signals to the gate electrode to render the switching device conductive causing the energy storage device to release its energy through the second loop preventing release of the stored energy through the first loop, and (g) output means common to both of the discharge loops for deriving output pulses whenever the energy storage means releases stored energy through either of the discharge loops.

2. An electronic clock circuit including (a) unijunction transistor and a capacitor, (b) means for charging the capacitor, (c) means for connecting the unijunction transistor and the capacitor in a relaxation oscillator circuit having therein a first discharge loop for the capacitor through which the capacitor periodically discharges in the normal operation of the oscillator, the periodical discharges appearing at a first predetermined frequency, (d) a silicon controlled rectifier having a gate electrode, means for connecting the silicon controlled rectifier and the capacitor in a second discharge loop for the capacitor, (e) means for applying input pulses at a second predetermined frequency to the gate electrode to render the silicon controlled rectifier conductive to cause the capacitor to discharge in the second loop in synchronism with the input pulses rendering the oscillator inoperative, (f) first output means common to both of the discharge loops for deriving output pulses whenever the capacitor discharges through either of the discharge loops, and (g) second output means for deriving output pulses from said first discharge loop only.

3. In a pulse generating circuit (a) a unijunction transistor and a capacitor, (b) means for charging the capacitor, (c) means for connecting the unijunction transistor and the capacitor in a relaxation oscillator circuit having therein a first discharge loop for the capacitor through which the capacitor discharges whenever a predetermined voltage is attained on the capacitor, the frequency of operation of the oscillator being determined by the rate at which the capacitor is charged to the predetermined voltage, (d) a silicon controlled rectifier having a gate electrode, (e) means for connecting the silicon controlled rectifier and the capacitor in a second discharge loop for the capacitor, (f) means for applying an input signal to the gate electrode to render the silicon controlled rectifier conductive thereby causing the capacitor to discharge in the second loop rendering the oscillator inoperative, (g) first output means common to both of the discharge loops for deriving output pulses whenever the capacitor discharges through either of the discharge loops, and (h) second output means connected to the first discharge loop for deriving output pulses only when the capacitor discharged through the first discharge loop.

References Cited by the Examiner

UNITED STATES PATENTS

| | | | |
|---|---|---|---|
| 3,018,384 | 1/62 | Zrubek | 307—88.5 |
| 3,036,225 | 5/62 | Kladde | 307—88.5 |
| 3,115,970 | 12/63 | Husome | 307—88.5 |

ROY LAKE, *Primary Examiner.*

JOHN KOMINSKI, *Examiner.*